(12) United States Patent
Joo et al.

(10) Patent No.: US 7,052,951 B2
(45) Date of Patent: May 30, 2006

(54) FERROELECTRIC MEMORY DEVICES WITH ENHANCED FERROELECTRIC PROPERTIES AND METHODS FOR FABRICATING SUCH MEMORY DEVICES

(75) Inventors: Heung-Jin Joo, Gyeonggi-do (KR); Ki-Nam Kim, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/776,394

(22) Filed: Feb. 11, 2004

(65) Prior Publication Data

US 2004/0164323 A1    Aug. 26, 2004

(30) Foreign Application Priority Data

Feb. 21, 2003    (KR)    ...................... 10-2003-0011099

(51) Int. Cl.
*H01L 21/8242*    (2006.01)

(52) U.S. Cl. ........................ 438/239; 438/253; 438/396

(58) Field of Classification Search ................ 438/239, 438/253, 393, 396
See application file for complete search history.

(56) References Cited

U.S. PATENT DOCUMENTS

| | | | |
|---|---|---|---|
| 5,119,154 A | 6/1992 | Gnadinger | |
| 5,854,104 A | 12/1998 | Onishi et al. | |
| 6,066,868 A * | 5/2000 | Evans, Jr. | 257/295 |
| 6,281,537 B1 * | 8/2001 | Kim | 257/295 |
| 6,339,007 B1 * | 1/2002 | Wang et al. | 438/393 |
| 6,410,397 B1 * | 6/2002 | Ochiai et al. | 438/381 |
| 6,590,252 B1 * | 7/2003 | Kutsunai et al. | 257/310 |
| 6,790,676 B1 * | 9/2004 | Cerva et al. | 438/3 |
| 6,844,583 B1 * | 1/2005 | Kim et al. | 257/306 |
| 6,933,156 B1 * | 8/2005 | Wang et al. | 438/3 |
| 2003/0183936 A1 * | 10/2003 | Ito et al. | 257/758 |

FOREIGN PATENT DOCUMENTS

| | | |
|---|---|---|
| KR | 2000-0029860 | 5/2000 |
| KR | 2001-100921 | 11/2001 |
| KR | 2001-0100921 | 11/2001 |
| KR | 2002-86568 | 11/2002 |
| KR | 2003-0001217 | 1/2003 |

OTHER PUBLICATIONS

Notice to File a Response/Amendment to the Examination Report dated Dec. 17, 2004 for corresponding KR application No. 2003-11099.

Office Action of corresponding Korean Application No. 10-22003-0011099 with cited references.

* cited by examiner

*Primary Examiner*—T. N. Quach
(74) *Attorney, Agent, or Firm*—Myers Bigel Sibley & Sajovec

(57) ABSTRACT

Ferroelectric memory devices and methods for fabricating such devices are provided. The ferroelectric memory device may comprise one or more interlayer dielectric layers on a semiconductor substrate, an oxygen-diffusion barrier pattern on the interlayer dielectric layer(s), and an upper insulating layer that is on the interlayer dielectric layer(s) that at least partially surrounds the oxygen-diffusion barrier pattern. These devices further include a capacitor that has a bottom electrode that is on the oxygen-diffusion barrier layer and on at least a portion of the upper insulating layer, a ferroelectric layer that is on the bottom electrode, and a top electrode that is on the ferroelectric layer. In some embodiments of the present invention, the top surface of the upper insulating layer is higher than the top surface of the oxygen-diffusion barrier pattern.

28 Claims, 11 Drawing Sheets

FERROELECTRIC MEMORY DEVICES WITH ENHANCED FERROELECTRIC PROPERTIES AND METHODS FOR FABRICATING SUCH MEMORY DEVICES

CROSS REFERENCE TO RELATED APPLICATION

This application claims the benefit of Korean Patent Application No. 10-2003-11099, filed on Feb. 21, 2003, which is incorporated herein in its entirety by reference.

FIELD OF THE INVENTION

The present invention relates to semiconductor memory devices and, more particularly, to ferroelectric memory devices and methods of fabricating such devices.

BACKGROUND OF THE INVENTION

As is well known in the art, ferroelectric materials are materials that exhibit a spontaneous polarization in response to an applied electric field due to the atomic displacement of the body-centered atom in the perovskite ($ABO_3$) structure. With these materials, a change in the direction of the electric field causes a change in the direction of the atomic displacement. Ferroelectric materials have two stable states, which makes these materials well-suited for use in memory applications. Furthermore, ferroelectric materials retain their polarization state after the applied electric field is removed. As such, ferroelectric materials may be used to fabricate non-volatile memory devices.

Ferroelectric memory devices may exhibit excellent endurance, high operation speeds (e.g., several tens of nano-seconds), low operation voltages (e.g., 5 Volts) and low standby currents (e.g., 1 mA). Based on these characteristics, ferroelectric memory devices are considered promising devices as the next-generation of semiconductor memory devices. However, the next-generation memory devices will need to be highly integrated devices. To provide such high integration, it may be necessary to secure reliable one-transistor/one-capacitor (1T/1C) cell structures, reduced size ferroelectric capacitors, multi-layer interconnection processes, hot temperature retention, read and write endurance equal to DRAM and SRAM memory devices and various other device characteristics.

Conventional dynamic random access memory devices do not include ferroelectric capacitors or other ferroelectric materials. As such, the methods used to fabricate ferroelectric memory devices may differ in various aspects from the methods that are used to fabricate conventional DRAM memory devices. By way of example, the polysilicon that is used in the fabrication of many conventional DRAM memory devices may react very actively with the ferroelectric material. As such, a noble metal, such as platinum (Pt), or a conductive oxide, such as ruthenium dioxide ($IrO_2$), is often used to form the capacitor electrode in ferroelectric memory devices.

Like DRAM memory devices, ferroelectric memory devices may include a transistor and a ferroelectric capacitor that is electrically connected to the transistor. This connection may be established by a local interconnection that is formed of metal. An example of a method in which a local interconnection is used to electrically connect a transistor to a ferroelectric capacitor is disclosed in U.S. Pat. No. 5,119,154 entitled "FERROELECTRIC CAPACITOR AND METHOD FOR FORMING LOCAL INTERCONNECTION."

Another method for establishing the interconnection between the transistor and the ferroelectric capacitor is to use a contact plug that is formed of a conductive material, such as polysilicon. An example of this method is disclosed in U.S. Pat. No. 5,854,104 entitled "PROCESS FOR FABRICATING NONVOLATILE SEMICONDUCTOR MEMORY DEVICE HAVING A FERROELECTRIC CAPACITOR" that is assigned to Sharp Co. of Japan. This method may provide for higher integration of the ferroelectric memory cells.

In a ferroelectric memory device, it typically is desirable that the ferroelectric material have a crystalline structure, such as a perovskite structure, to provide the hysteresis characteristic in response to an applied external voltage. To achieve this crystalline structure, the ferroelectric material typically is thermally treated at a temperature of 550 degrees Centigrade or more after it is deposited. This thermal treatment may cause a thin insulating layer to form between the contact plug and the lower electrode, which may cause the contact resistance to increase. If a polysilicon contact plug is used, a silicon oxide layer may form between the contact plug and the lower electrode. To help avoid the formation of such a layer, an oxygen-diffusion barrier may be formed between the contact plug and the lower electrode of the ferroelectric capacitor.

FIGS. 1 and 2 are cross-sectional views of selected layers of a conventional ferroelectric memory device that schematically illustrate a method for fabricating a ferroelectric capacitor that has a conventional contact plug.

Referring to FIG. 1, a transistor (not shown) is formed on a semiconductor substrate (not shown) and then an interlayer insulating layer 11 is formed on the transistor and the semiconductor substrate. The interlayer insulting layer 11 is patterned to form an opening that exposes a drain region of the transistor in the semiconductor substrate. A conductive material such as, for example, polysilicon is deposited in the opening, thereby forming a contact plug 13. Next, a stacked capacitor structure 23 is formed on the interlayer insulating layer 11 and the contact plug 13. As shown in FIG. 1, the stacked capacitor structure may comprise an oxygen-diffusion barrier layer 15, a lower electrode layer 17, a ferroelectric layer 19 and an upper electrode 21 that are sequentially stacked on the interlayer insulating layer 11 and the contact plug 13.

As shown in FIG. 2, the stacked capacitor structure 23 is patterned to form a ferroelectric capacitor 25 that is electrically connected to the contact plug 13. However, etching damage 27 may occur in the ferroelectric layer 19 during the patterning processes. Specifically, as shown in FIG. 2, sidewalls of the ferroelectric layer 19 may be damaged during the etching of the lower electrode 17 and the oxygen-diffusion barrier layer 15 because the ferroelectric layer 19 is exposed during the etching of these layers. This etching damage 27 may cause degradation to the ferroelectric properties of the ferroelectric layer 19, thereby deteriorating the performance of the ferroelectric memory device. The impact of this etching damage 27 typically increases with an increasing degree of device integration. Moreover, the etching damage 27 to the ferroelectric layer 19 also tends to increase with increasing thickness of the oxygen-diffusion barrier layer 15. However, if the thickness of the oxygen-diffusion barrier layer 15 is reduced to minimize the etching damage 27, the oxygen-diffusion barrier layer 15 may not prevent oxidation of the contact plug 13 and, thus, the contact resistance may increase.

SUMMARY OF THE INVENTION

Pursuant to certain embodiments of the present invention, ferroelectric memory devices are provided which comprise one or more interlayer dielectric layers on a semiconductor substrate, an oxygen-diffusion barrier pattern on the interlayer dielectric layer(s), and an upper insulating layer on the interlayer dielectric layer(s) that at least partially surrounds the sidewalls of the oxygen-diffusion barrier pattern and whose top surface is higher than the top surface of the oxygen-diffusion barrier pattern. These devices further include a capacitor that has a bottom electrode that is on the oxygen-diffusion barrier pattern and on at least a portion of the upper insulating layer, a ferroelectric layer that is on the bottom electrode, and a top electrode that is on the ferroelectric layer.

The oxygen-diffusion barrier pattern may include at least one material selected from the group of iridium, ruthenium and osmium. In certain embodiments of the present invention, the oxygen-diffusion barrier pattern is formed of iridium and titanium aluminum nitride that are sequentially stacked or formed of iridium, titanium aluminum nitride and titanium that are sequentially stacked. Both the top and bottom electrodes may comprise either a single layer electrode formed of a noble metal or a conductive noble metal oxide or a multi-layer electrode formed of a noble metal layer and a conductive noble metal oxide layer.

The surface area of a top surface of the bottom electrode may exceed the surface area of the top surface of the oxygen-diffusion barrier pattern such that the bottom electrode shields the ferroelectric layer from contact with the oxygen-diffusion barrier pattern. The ferroelectric memory device may also include a transistor that has a gate electrode formed on the semiconductor substrate and source/drain regions at both sides of the gate electrode. A conductive contact plug may also be provided that penetrates one or more of the interlayer dielectric layers to electrically connect one of the source/drain regions to the oxygen-diffusion barrier pattern.

Pursuant to further embodiments of the present invention, ferroelectric memory devices are provided that include a lower insulating layer on the semiconductor substrate, a plug that penetrates the lower insulating layer to electrically connect to the substrate, an oxygen-diffusion barrier pattern that is on the plug, an upper insulating layer on the lower insulating layer and a capacitor that is electrically connected to the plug. The capacitor includes a bottom electrode that is on the oxygen-diffusion barrier pattern and on at least a portion of the upper insulating layer, a ferroelectric layer that is on the bottom electrode, and a top electrode that is on the ferroelectric layer.

In these embodiments of the present invention, the top surface of the upper insulating layer may be higher than the top surface of the oxygen-diffusion barrier pattern. The oxygen-diffusion barrier pattern may be recessed between first and second portions of the upper insulating layer. The oxygen-diffusion barrier pattern may include at least one material selected from the group of iridium, ruthenium and osmium.

Pursuant to still further embodiments of the present invention, methods of fabricating ferroelectric memory devices are provided in which a lower insulating layer that includes a conductive plug is formed on a semiconductor substrate. An oxygen-diffusion barrier pattern is then formed that is electrically connected to the conductive plug, and an upper insulating pattern is formed on the lower insulating layer such that it surrounds the sidewalls of the oxygen-diffusion barrier pattern and such that the top surface of the upper insulating pattern is higher than the top surface of the oxygen-diffusion barrier pattern. A lower electrode layer is formed on the upper insulating pattern and the oxygen-diffusion barrier pattern, and a ferroelectric layer is formed on the lower electrode layer. Finally, an upper electrode layer is formed on the ferroelectric layer. The upper electrode layer, the ferroelectric layer and the lower electrode layer may also be patterned.

The oxygen-diffusion barrier pattern may be formed by forming a conductive oxygen-diffusion barrier layer and a hard mask layer on the lower insulating layer and then patterning the hard mask layer and the conductive oxygen-diffusion barrier layer to be electrically connected to the contact plug. The upper insulating pattern may be formed by forming an upper insulating layer on the lower insulating layer, the conductive oxygen-diffusion barrier pattern and the hard mask pattern, and then planarizingly etching the upper insulating layer using the hard mask pattern as a planarization to form the upper insulating pattern. The hard mask pattern may then be selectively removed. The hard mask layer may be formed of a material that has etch selectivity with respect to the upper insulating layer. In embodiments of the present invention, the hard mask layer may be formed of a material that includes nitrogen such as titanium nitride, silicon nitride or titanium aluminum nitride.

In other embodiments of the present invention, the upper insulating pattern may be formed by forming an upper insulating layer on the lower insulating layer and then patterning the upper insulating layer to form the upper insulating pattern and to form an opening exposing the conductive plug. The oxygen-diffusion barrier pattern may be formed by first forming an oxygen-diffusion barrier layer in the opening and on the upper insulating layer and then etching a portion of the oxygen-diffusion barrier layer filling the opening such that the top surface of the oxygen-diffusion barrier layer is lower than a top surface of the upper insulating layer.

In these methods, the oxygen-diffusion barrier pattern may be formed as a single layer pattern that includes iridium, ruthenium or osmium, a double layer pattern that is formed by sequentially stacking iridium and titanium aluminum nitride layers or a triple layer pattern formed by sequentially stacking iridium, titanium aluminum nitride and titanium layers. Both the lower and the upper electrode may comprise either a single layer electrode formed of a noble metal or a conductive noble metal oxide or a multi-layer electrode formed of a noble metal layer and a conductive noble metal oxide layer.

Pursuant to still further embodiments of the present invention, methods of forming ferroelectric memory devices are provided in which a lower insulating layer that includes a contact plug is formed on a semiconductor substrate. An upper insulating layer is formed on the lower insulting layer and then patterned to form an opening that exposes the conductive plug and the lower insulating layer. An oxygen-diffusion barrier pattern is formed in the opening such that the top surface of the oxygen-diffusion barrier pattern is lower than the top surface of the upper insulating layer, and a lower electrode layer is formed on the upper insulating layer and the oxygen-diffusion barrier layer. A ferroelectric layer is formed on the lower electrode layer, and an upper electrode layer is formed. The upper electrode layer, the ferroelectric layer and the lower electrode layer may then be patterned.

DETAILED DESCRIPTION

Figure 1:
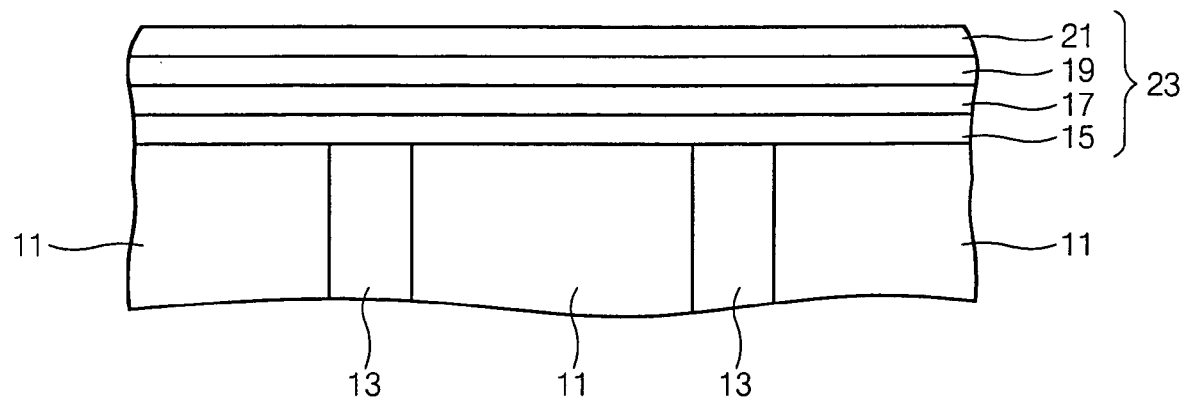
FIGS. 1 and 2 are cross-sectional views schematically illustrating aspects of a conventional method for fabricating a ferroelectric memory device.
Figure 2:
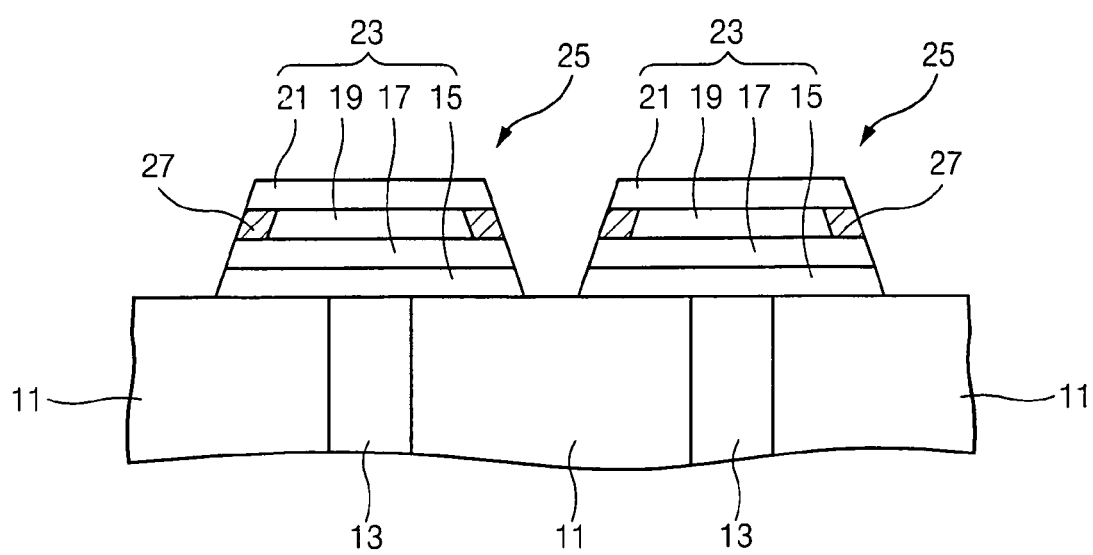

The present invention will now be described more fully with reference to the accompanying drawings, in which examplary embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, the thickness of the layers and regions are exaggerated for clarity. It will also be understood that when a layer or element is referred to as being "on" another layer or substrate, it can be directly on the other layer, element or substrate, or intervening layers and/or elements may also be present. In contrast, when a layer/element is referred to as being "directly on" another layer/element, there are no intervening layers or elements present. Likewise, when an element is described as being "between" two other elements it may be the only element between the two other elements or additional elements may also be present. Like numbers refer to like elements throughout the specification.

The present invention relates to ferroelectric memory devices and methods for fabricating such devices.

FIGS. 3 through 11 are cross-sectional views showing methods for fabricating ferroelectric memory devices according to some embodiments of the present invention. FIGS. 3 through 11 are taken along a direction parallel to a bit line (i.e., a data line) and a direction perpendicular to a gate line. While only two ferroelectric capacitors are illustrated in the drawings, it will be appreciated that, in typical applications, a larger array of memory cells would be provided.

Figure 3:
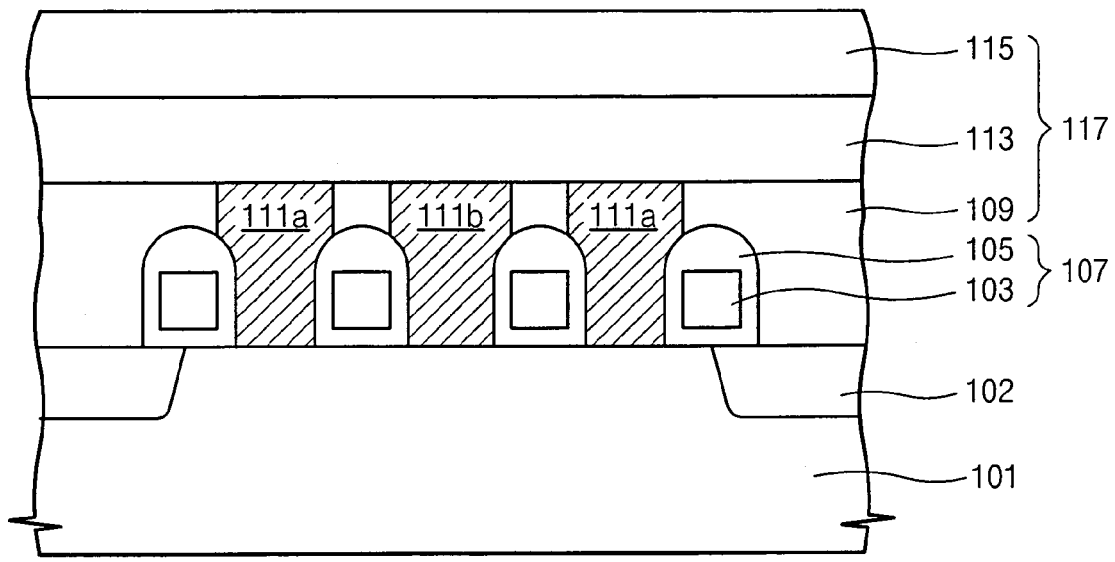
FIGS. 3 through 11 are schematic cross-sectional views illustrating operations for fabricating ferroelectric memory devices according to embodiments of the present invention.

As shown in FIG. 3, a device isolation region 102 is formed in a predetermined region of a semiconductor substrate 101 to define an active region. A variety of methods for forming the device isolation region are known in the art such as, for example, LOCOS isolation processes and trench isolation processes. Trench isolation processes may be particularly useful in applications where the memory device has a high level of integration.

As is also shown in FIG. 3, a transistor 107 is formed on the active region. The transistor 107 serves as a word line. The transistor 107 may comprise (a) a gate electrode 103 that is electrically insulated from the active region by a gate insulating layer and (b) source/drain regions that are formed in the active region on either side of the gate electrode 103 by implanting impurities in the semiconductor substrate 101. The active region below the gate electrode 103, i.e., the active region between the source/drain regions, serves as a channel region. The gate electrode 103 may be protected by sidewall spacers and a hard mask 105. The transistor 107 may further comprise additional elements such as, for example, a lightly doped drain (LDD) region, double gate spacers and the like. It will also be appreciated that other transistor configurations may be used. For example, the hard mask 105 could be omitted.

Next, a lower insulating layer 117 is formed on the semiconductor substrate 101 and the transistor 107. The lower insulating layer 117 may comprise several stacked insulating layers 109, 113, 115. A bit line (not shown in the drawings) may be electrically connected to the drain region of the transistor 107. The bit line may be formed within the lower insulating layer 117. In embodiments of the present invention, the bit line and the drain region may be directly connected. In other embodiments (as illustrated in FIG. 3), a bit line contact pad 111b may be formed which is electrically connected to the drain region, and then the bit line may be formed on (or at least in electrical contact with) the bit line contact pad 111b.

In the embodiment of the invention depicted in FIG. 3, the bit line may be formed as follows. First, a first interlayer insulating layer 109 is formed on the semiconductor substrate 101 and the transistor 107. The first insulating layer may, for example, comprise a silicon oxide layer that is deposited by a conventional chemical vapor deposition (CVD) process so that the first interlayer insulating layer 109 covers the transistor 107. A predetermined region of the first interlayer insulating layer 109 may then be etched at both sides of the transistor 107 to form an opening that exposes the drain region of the semiconductor substrate 101. An opening in the first interlayer insulating layer 109 may simultaneously be formed that exposes the source region of the semiconductor substrate 101. These opening may be filled with conductive materials to form the bit line contact pad 111b and the capacitor contact pads 111a that are shown in FIG. 3. After the contact pads 111a and 111b are formed, a second interlayer insulating layer 113 may be formed using, for example, chemical vapor deposition techniques, so as to insulate the contact pads 111a and 111b. Next, a predetermined region of the second interlayer insulting layer 113 may be etched to form a contact hole (not shown in FIG. 3) that exposes the top surface of the bit line contact pad 111b. Then, a conductive material (not shown in FIG. 3) for a bit line may be formed on the second interlayer insulating layer 113 to fill the contact hole. This conductive material may then be patterned to form a bit line (not shown in FIG. 3). Thereafter, a third interlayer insulting layer 115 may be formed on the entire bit line using, for example, chemical vapor deposition techniques.

Figure 4:
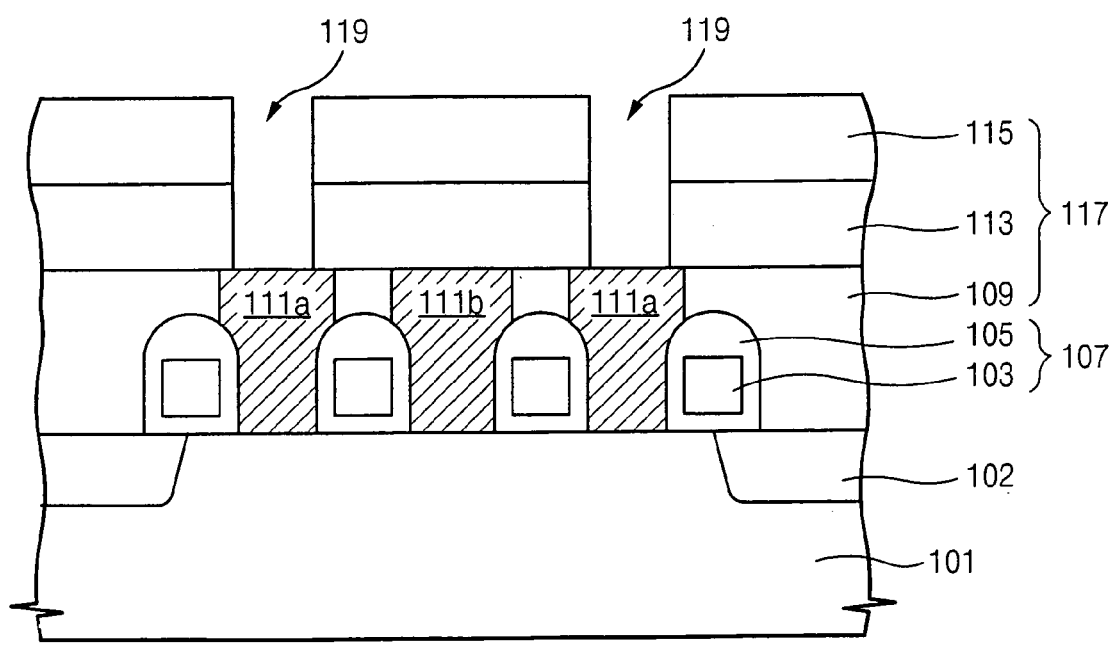

As shown in FIG. 4, the third interlayer insulting layer 115 and the second interlayer insulting layer 113 are patterned to form a contact hole 119 that exposes the top surface of the capacitor contact pads 111a.

Figure 5:
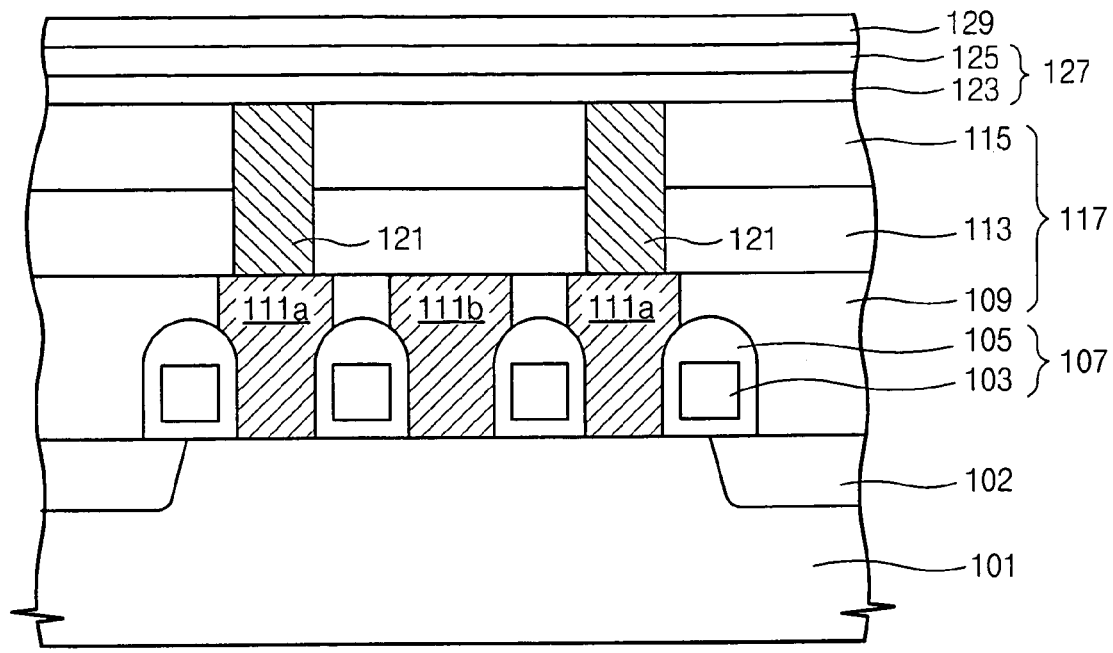

As shown in FIG. 5, a conductive material such as polysilicon or tungsten may be deposited into the contact holes 119 to form contact plugs 121 that, as will be explained herein, each electrically connect a ferroelectric capacitor to a source region in the semiconductor substrate. After the contact plugs 121 are formed, an oxygen-diffusion barrier layer 127 and a hard mask layer 129 are formed on the third interlayer insulating layer 115 of the lower insulating layer 117.

The oxygen-diffusion barrier layer 127 may be a non-oxidized conductive layer, or a layer of oxidized material that retains its conductivity and prevents oxygen diffusion. The material used to form the for oxygen-diffusion barrier layer may comprise, for example, noble metals, such as iridium, ruthenium and osmium, titanium aluminum nitride, titanium, etc.

As shown in FIG. 5, in some embodiments of the present invention, the oxygen-diffusion barrier layer 127 may be formed as a double layer comprising a titanium aluminum nitride layer 123 and an iridium layer 125 that are sequentially stacked. However, it will be appreciated that this is only one exemplary embodiment and that the oxygen-diffusion barrier layer 127 may be a single layer or a multi-layer structure and that the layer(s) may each include one or more materials that act as an oxygen diffusion barrier. For example, the oxygen-diffusion barrier layer 127 could alternatively be formed as a single iridium, ruthenium or osmium layer, as a double layer that comprises layers of iridium and titanium aluminum nitride that are sequentially stacked, or as a triple layer that comprises layers of iridium, titanium aluminum nitride and titanium that are sequentially stacked.

A hard mask layer 129 may be formed on the oxygen-diffusion barrier layer 127 for use in patterning the oxygen-diffusion barrier layer 127 and for use as a planarization stop layer in a subsequent planarization process. The hard mask layer 129 may be formed of a material having etch selectivity with respect to an upper insulating layer (see layer 131 in FIG. 6). For example, if the upper insulating layer 131 is formed as an oxide layer using a chemical vapor deposition process, the hard mask layer 129 may be formed of a nitride material. In embodiments of the present invention, the hard mask layer 129 may comprise a single layer or a multi-layer structure that includes, for example, titanium nitride, silicon nitride, and/or titanium aluminum nitride. It will also be appreciated that numerous other materials may be used to form the hard mask layer 129.

Figure 6:
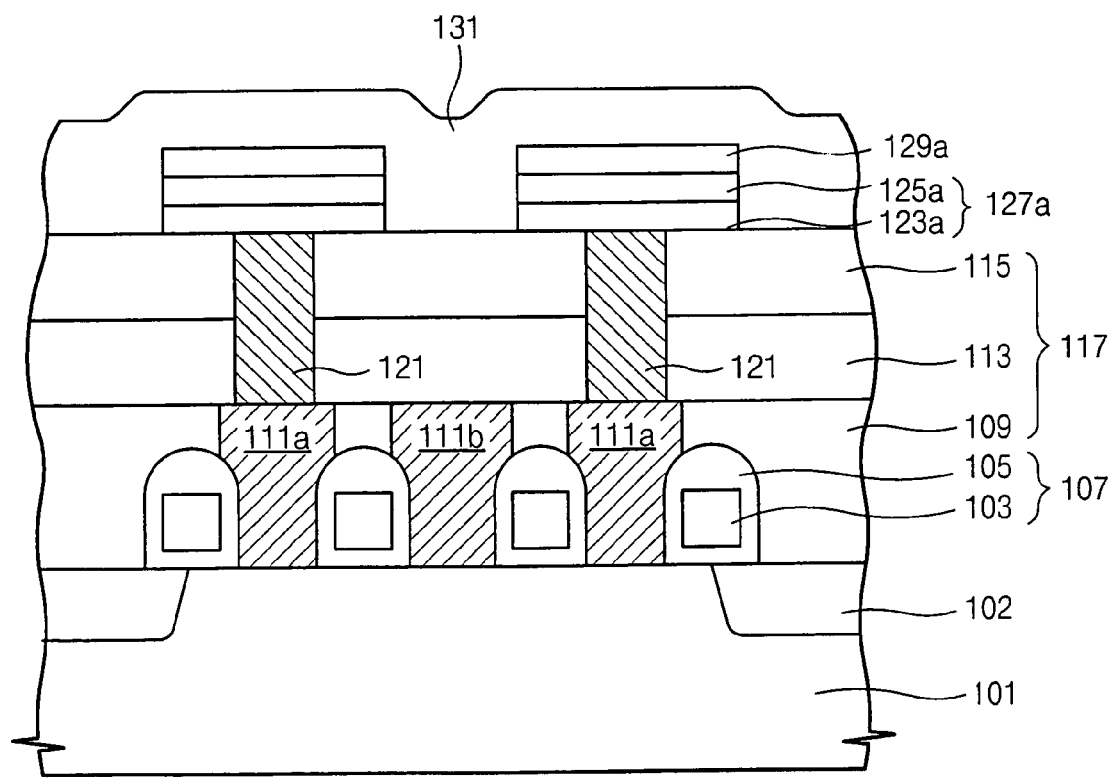

As shown in FIG. 6, the hard mask layer 129 may be patterned using, for example, a photolithographic process, to form a hard mask pattern 129a. The hard mask pattern 129a may then be used to pattern the underlying oxygen-diffusion barrier layer 127 to form an oxygen-diffusion barrier pattern 127a that is electrically connected to the contact plug 121. An upper insulating layer 131 is formed on the third interlayer insulating layer 115 and the hard mask pattern 129a. The upper insulating layer 131 may be formed of material having etch selectivity with respect to the hard mask pattern 129a. For example, if the hard mask pattern 129a comprises a nitride layer, the upper insulating layer 131 might be formed as a silicon oxide layer.

Figure 7:
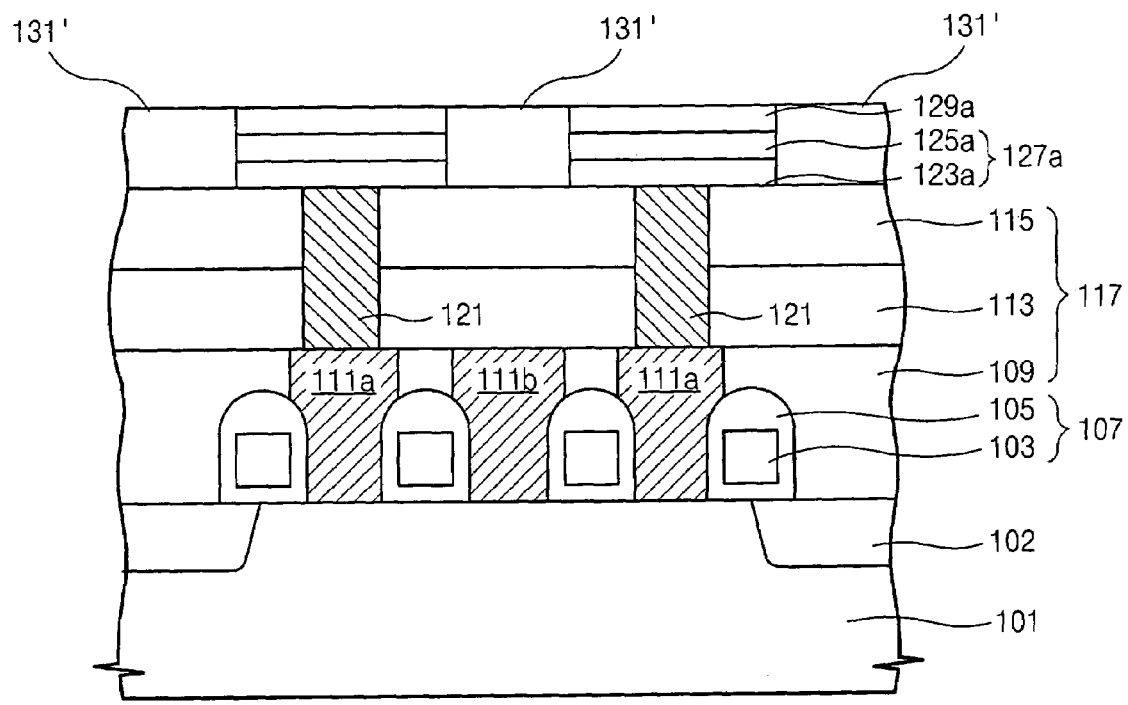

As shown in FIG. 7, next a planarization process may be applied to the upper insulating layer 131. The hard mask pattern 129a may be used as a planarization stop layer. This planarization process may be accomplished, for example, by etching the upper insulating layer 131 in a planar manner using a slurry that has a high etch selectivity with respect to the upper insulating layer 131 (as compared to the hard mask pattern 129a) until the hard mask pattern 129a is exposed.

Figure 8:
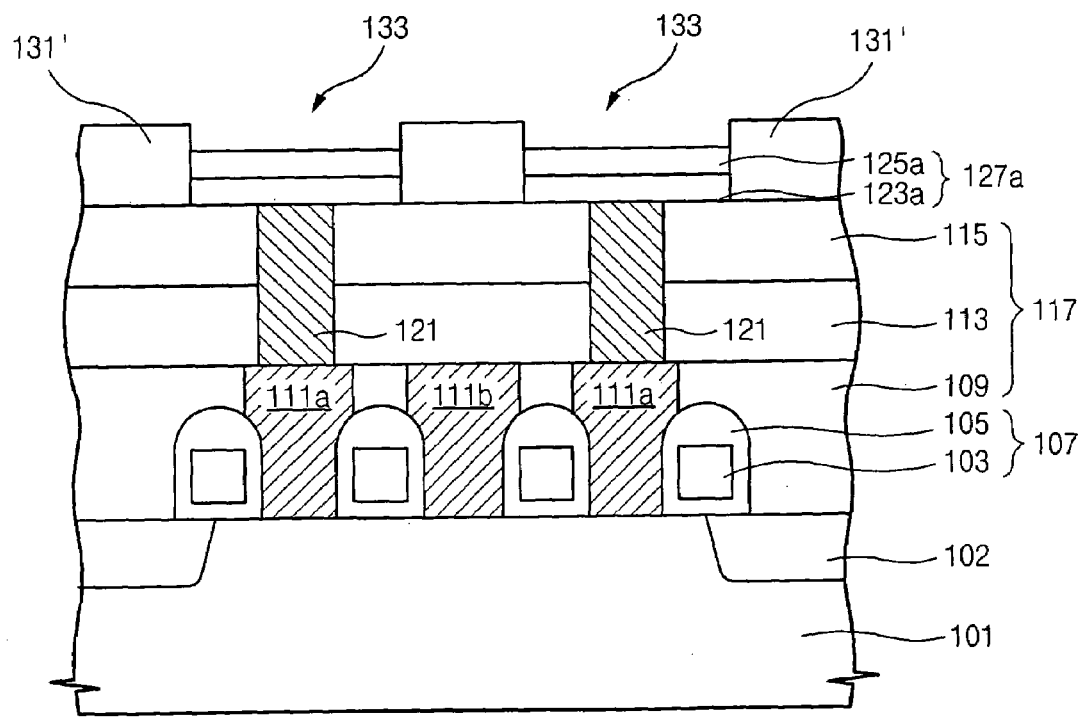

As shown in FIG. 8, the hard mask pattern 129a may then be selectively removed using, for example, an etchant or etch gas. The removal of the hard mask pattern 129a leaves a recess region 133 because the top surface 131' of the upper insulating layer 131 is higher than the top surface of the oxygen-diffusion barrier pattern 127a.

Figure 9:
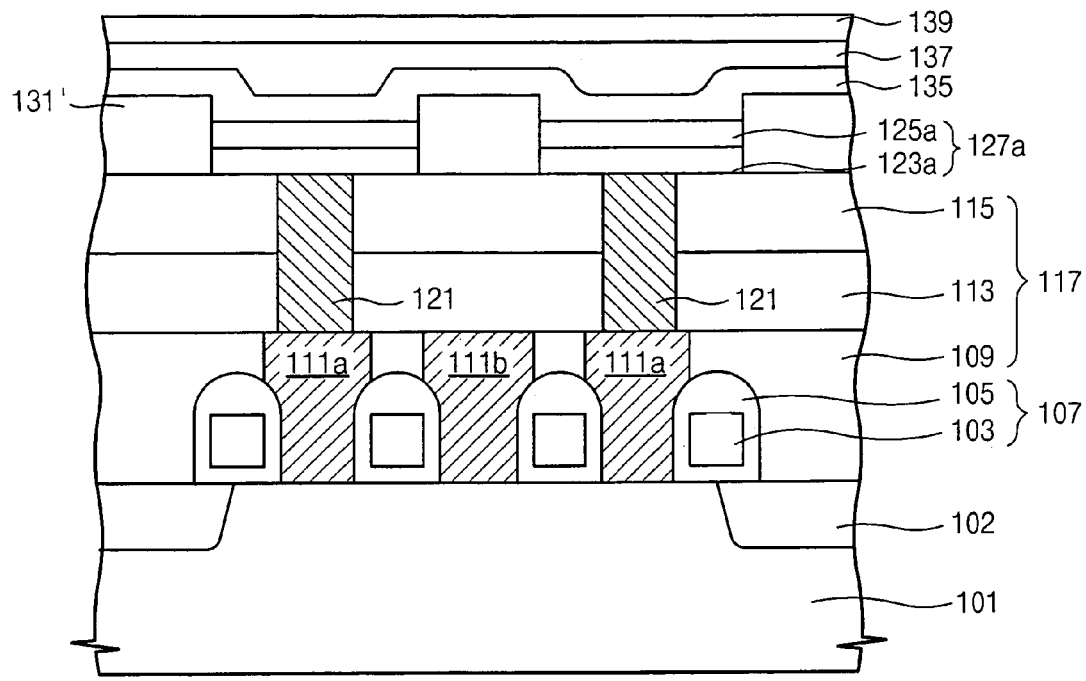

A lower electrode layer 135 may then be formed on the upper insulating layer 131' and the oxygen diffusion barrier pattern 127a. As shown in FIG. 9, the lower electrode layer 135 fills in the recess region 133. Next, a ferroelectric layer 137 and an upper electrode layer 139 may be sequentially formed on the lower electrode layer 135. The ferroelectric layer 137 may be formed on the lower electrode layer 135 such that it is not in contact with the oxygen-diffusion barrier pattern 127a or the upper insulating layer 131'.

The lower electrode layer 135 may be formed of a material that has a crystalline lattice that facilitates forming the ferroelectric layer 137 to have a ferroelectric crystalline structure. The lower electrode layer 135 may also be formed of a material capable of providing oxygen to the ferroelectric layer 137 which may improve the ability of the ferroelectric layer 137 to maintain its residual polarization even after the device has been used a large number of times (i.e., improved fatigue performance). In embodiments of the present invention, a conductive oxide such as, for example, iridium oxide ($IrO_2$), ruthenium oxide ($RuO_2$), lanthanum strontium cobalt oxide (LSCO), yttrium cobalt oxide (YBCO) and/or lanthanum nickel oxide (LNO) may be used to form the lower electrode 135, as each of these materials can provide oxygen to the ferroelectric layer and provide a lattice structure that facilitates forming a ferroelectric layer 137 having the desired crystalline structure. Noble metals, such as platinum (Pt), iridium (Ir), ruthenium (Ru), osmium (Os) and lanthanum (Ln) may likewise be used to form the lower electrode 135, as these material have a crystalline structure that facilitates forming a stable ferroelectric layer. It will also be appreciated that other materials may be used. In certain embodiments of the present invention, the lower electrode layer 135 may be formed as a multi-layer electrode instead of as a single layer electrode. For example, the lower electrode 135 could be formed as a first layer comprising a noble metal and a second layer comprising a conductive oxide. One such multi-layer lower electrode is a lower electrode layer 135 that comprises an iridium oxide layer and a platinum layer that are sequentially stacked. In such an embodiment of the present invention, the platinum layer may provide resistance to both heat and oxidation.

The ferroelectric layer 137 may be formed using any of a wide variety of ferroelectric materials such as, for example, PZT (Lead Zirconium Titrate), SBT (Strontium Barium Tantalum), SBTN (Strontium Barium Tantalum Nitride) and/or SBTT (Strontium Barium Tantalum Titanate). The ferroelectric layer 137 may be formed, for example, using the following process. First, the ferroelectric material is deposited on the bottom electrode 135 using a sol-gel coating method. Typically, the ferroelectric material, as deposited by a sol-gel method, will have a high-quality amorphous structure. The ferroelectric material is then thermally treated in a high temperature ambient to convert the amorphous structure into a ferroelectric lattice structure such as a perovskite, thereby forming the ferroelectric layer 137. If the topmost layer of the layer(s) composing the lower electrode 135 is formed of platinum, it may facilitate improving the stability of the ferroelectric layer 135 because the platinum provides a lattice structure that facilitates formation of the ferroelectric crystalline structure.

The upper electrode 139, like the lower electrode 135, may be a single layer electrode that comprises, for example, a noble metal layer or a conductive oxide layer. Alternatively, the upper electrode 139 may be formed as a multi-layer electrode such as, for example, an electrode that comprises both a noble metal layer and a conductive oxide layer. For example, the upper electrode 139 may comprise an iridium oxide layer and an iridium layer that are sequentially stacked to form the upper electrode layer 139. The conductive oxide electrode (i.e., the iridium oxide layer) provides oxygen to the ferroelectric layer 137, thereby improving the fatigue characteristics of the ferroelectric layer 137.

Figure 10:
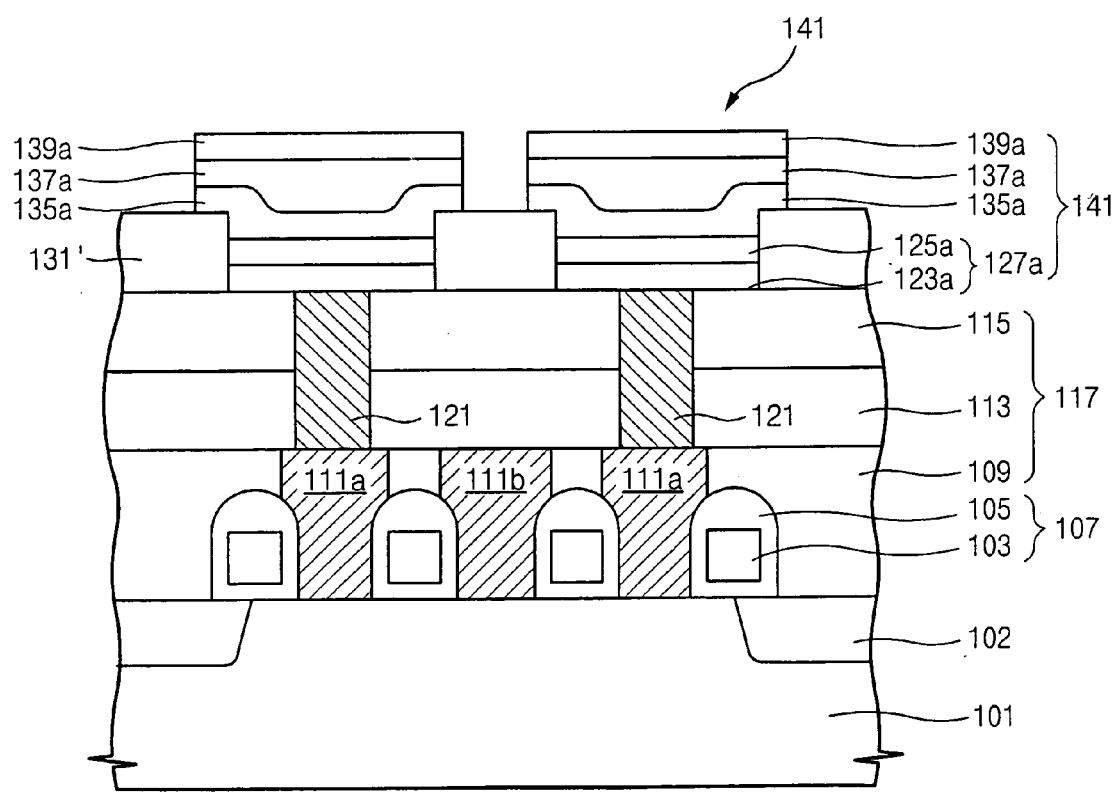

Next, as shown in FIG. 10, the upper electrode layer 139, the ferroelectric layer 137 and the lower electric layer 135 may be patterned to complete the ferroelectric capacitor 141. The ferroelectric capacitor 141 comprises the oxygen-diffusion barrier pattern 127a, the lower electrode 135a, the ferroelectric layer 137a and the upper electrode 139a. The oxygen-diffusion barrier pattern 127a is electrically connected to the source region of the transistor 107 by a contact plug 121 and a contact pad 111a.

As illustrated in FIG. 10, the lower electrode 135a is larger than the oxygen-diffusion barrier pattern 127a, such that the lower electrode 135a is formed on both the oxygen-diffusion barrier pattern 127a and on a portion of the upper insulating layer 131'.

Figure 11:
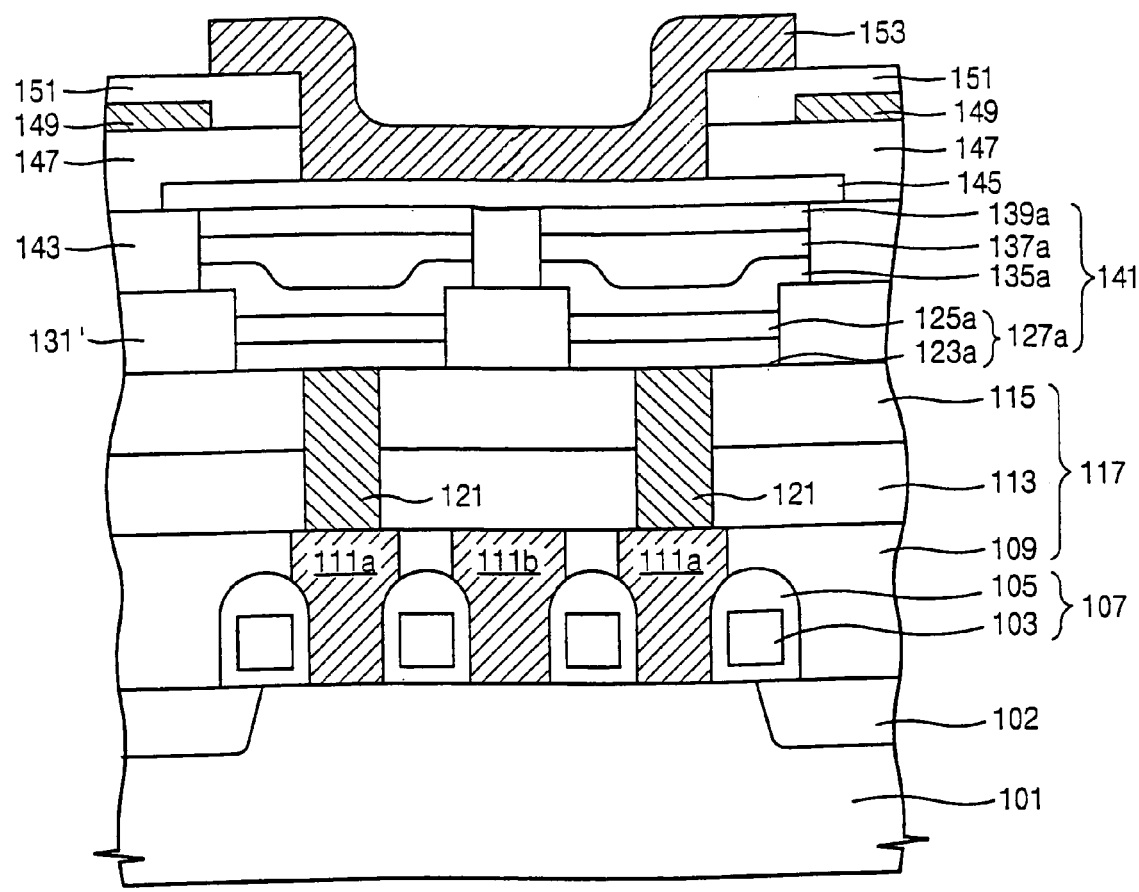

FIG. 11 illustrates processes that may be used to form the electrical interconnection to the upper electrode 139a. As shown in FIG. 11, a first insulating layer 143 is formed on the ferroelectric capacitor 141 and on the upper insulting layer 131. The first insulating layer 143 is then planarized until the top surface of the top electrode 139a is exposed. A protection layer (not shown) may be formed on the ferroelectric capacitor 141 and the upper insulting layer 131 before the insulating layer 143 is formed that serves to prevent hydrogen from penetrating into the ferroelectric capacitor 141 during formation of the first insulating layer 143. After the first insulating layer 143 is formed and planarized, a conductive layer may be deposited on the upper electrode 139a and the planarized first insulating layer 143. This conductive layer may then be patterned to form a lower interconnection 145 that is electrically connected to the upper electrode 139a. In this manner, the upper electrode 139a may be electrically connected to the lower interconnection 143 without a contact process, which may improve the contact resistance characteristic of the device and minimize/prevent misalignment problems that may arise in a contact process.

A second insulating layer 147 may then be formed on the lower interconnection 145 and the first insulating layer 143. A strapping line 149 is then formed which is electrically connected to the gate of the transistor 107. The strapping line 149 may be formed, for example, of aluminum or another material having good electrical conductivity. The access time to the transistor 107 selected during operation of the ferroelectric memory device may be reduced by provision of the strapping line 149.

A third insulating layer 151 may then be formed on the strapping line 149 and the second insulting layer 147. Predetermined portions of the second and third insulating layers 147 and 151 are then etched to form a via hole that exposes the lower interconnection 145. Then, a conductive material such as, for example, aluminum may be deposited in the via hole, and the conductive material is subsequently patterned to form an upper interconnection 153 (i. e., a plate line). The upper interconnection 153 is electrically connected to the upper electrode 139a through the lower interconnection 145. As the lower interconnection 145 is electrically connected to the adjoining upper electrode 139a, the process margin of the via hole process for forming the plate line 153 (i.e., the upper interconnection) is increased.

As is made clear from the above discussion, in some embodiments of the present invention the oxygen-diffusion barrier layer is patterned before the lower electrode layer, the ferroelectric layer and/or the upper electrode layer are formed. As a result, the oxygen-diffusion barrier layer may be formed to an increased thickness which may enhance the ability of the oxygen-diffusion barrier layer to prevent oxygen diffusion. Additionally, by patterning the oxygen diffusion barrier layer before deposition of the ferroelectric layer, it is possible to reduce the exposure time of the ferroelectric layer to the etch gas ambient.

The ferroelectric memory devices of certain embodiments of the present invention have a ferroelectric capacitor 141 that includes an oxygen-diffusion barrier pattern 127a that is electrically connected to the active region of the semiconductor substrate 101. The oxygen-diffusion barrier pattern 127a is surrounded by an upper insulating layer 131', with the top surface of the oxygen-diffusion barrier layer 127a disposed lower than the top surface of the upper insulating layer 131'. The lower electrode 135a covers the entire surface of the oxygen-diffusion barrier pattern 127a and a portion of the top surface of the adjoining upper insulating layer 131'. The ferroelectric layer 137a and the upper electrode 139a are sequentially stacked on the lower electrode 135a.

FIGS. 12 through 18 illustrate operations for fabricating a ferroelectric memory device according to further embodiments of the present invention. Explanation of steps in the fabrication process for the devices illustrated in FIGS. 12 through 18 that are identical to corresponding steps in the process described above for fabricating the ferroelectric memory devices of FIGS. 3 through 11 will not be repeated herein.

Figure 12:
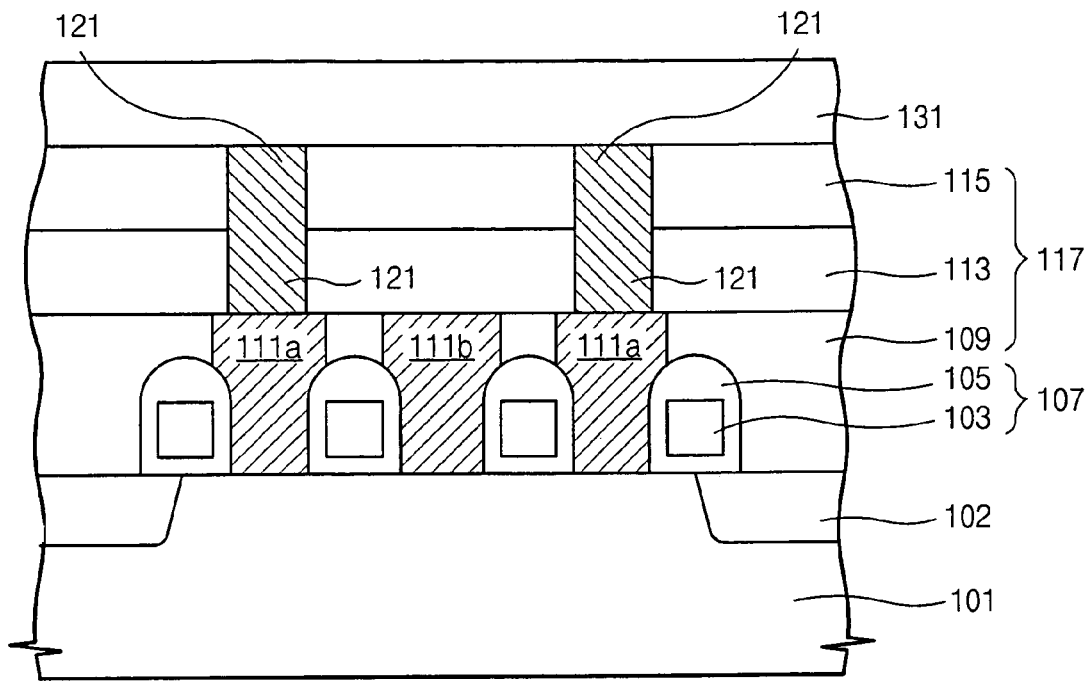
FIGS. 12 through 18 are schematic cross-sectional views illustrating operations for fabricating ferroelectric memory devices according to further embodiments of the present invention.

As shown in FIG. 12, device isolation layers, a transistor, a bit line and contact holes may be formed on a semiconductor substrate following the operations described above with respect to FIGS. 1 through 4. Then, contact plugs 121 may be formed by depositing conductive material into the contact holes. An upper insulating layer 131 may then be formed on the lower insulating layer 117 and the contract plug 121.

Figure 13:
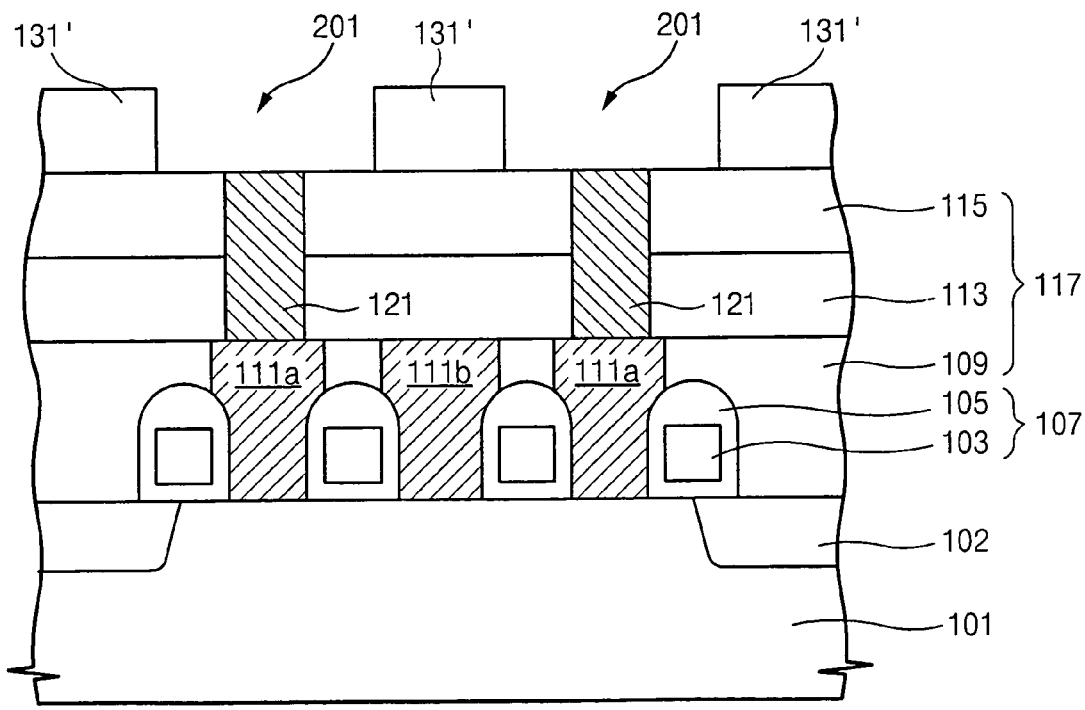

As shown in FIG. 13, a predetermined region of the upper insulating layer 131 may then be etched to form openings 201 that expose the contact plugs 121 and portions of the lower insulating layer 117 that adjoin the contact plugs 121. This may be accomplished by forming a photoresist pattern (not shown) on the upper insulting layer 131 which is then used as an etch mask to etch portions of the upper insulating layer 131 that are exposed by the photoresist pattern.

Figure 14:
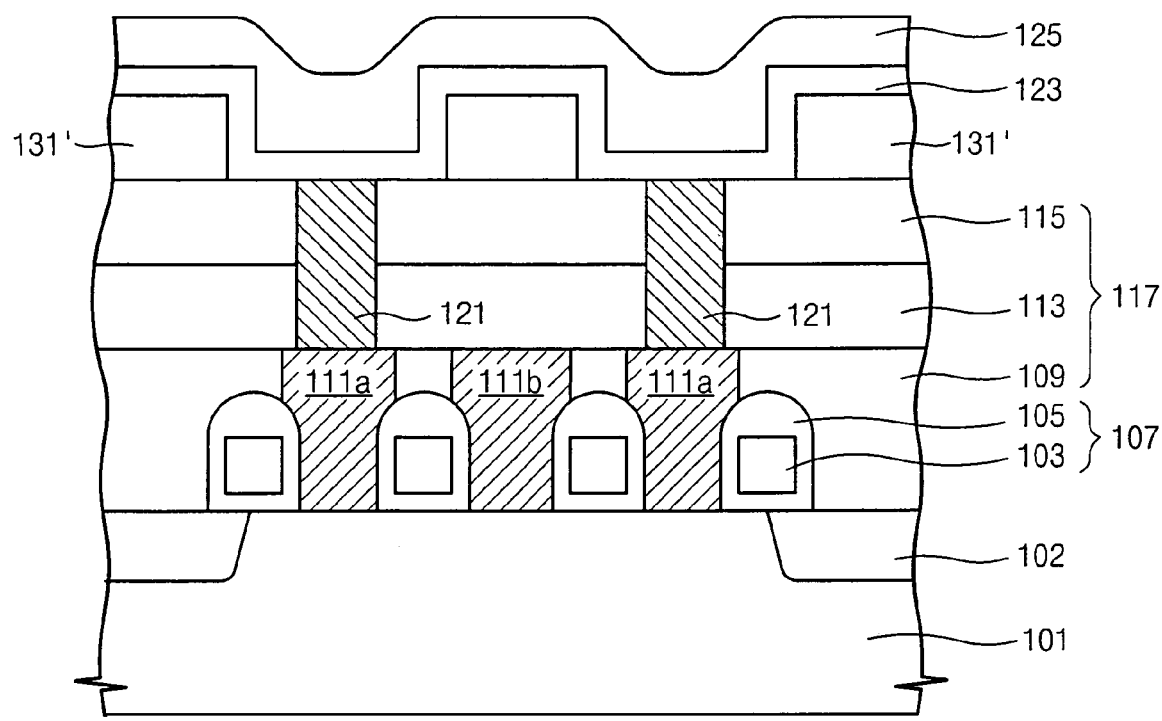
Figure 15:
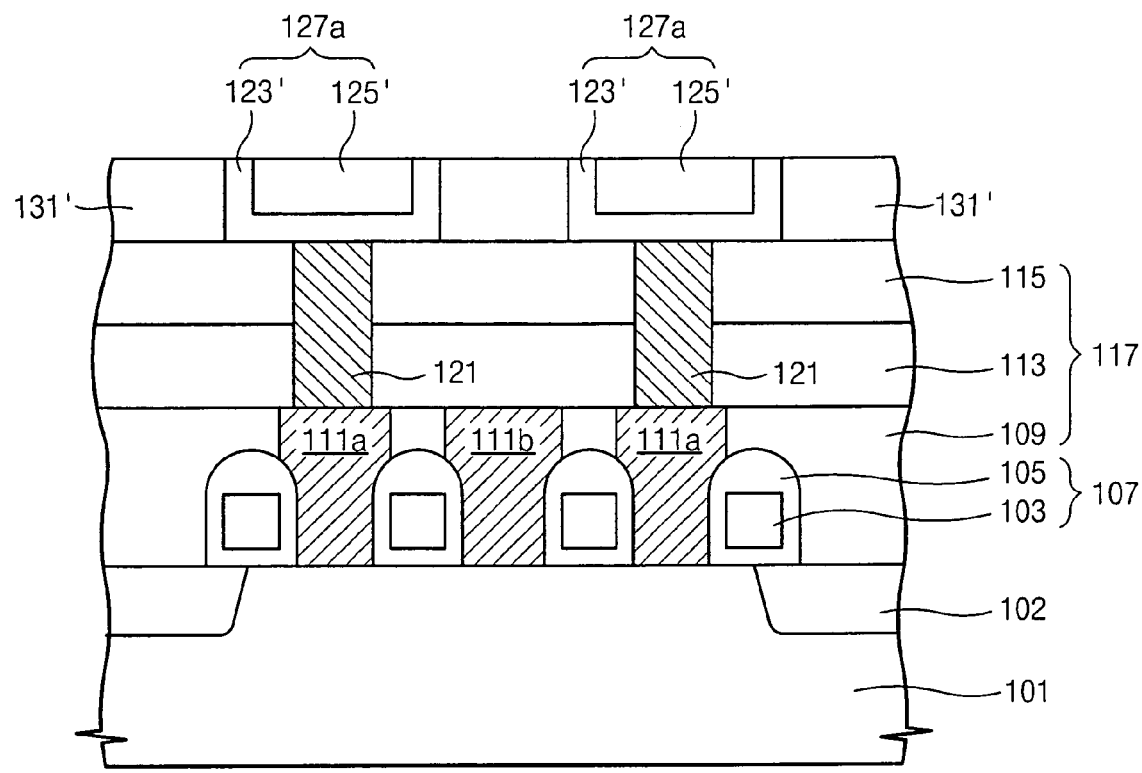

As illustrated in FIGS. 14 and 15, an oxygen-diffusion barrier pattern 127a is formed in the holes 201 such that the height of the oxygen-diffusion barrier pattern 127a is lower than the height of the upper insulating layer 131'. As explained previously, the oxygen-diffusion barrier pattern 127a may be a conductive material that is not oxidized or a conductive oxide material that acts as a barrier to oxygen diffusion. In an exemplary embodiment of the present invention, the oxygen-diffusion barrier pattern 127a may be a double layer pattern comprising a titanium aluminum nitride pattern 123a' and an iridium pattern 125a' that are sequentially stacked. However, it will be appreciated that this is only an example of one possible oxygen-diffusion barrier layer 127a and that a single layer comprising those or other materials or a multi-layer of combination thereof may also be used. Other exemplary embodiments of the oxygen-diffusion barrier pattern 127a are a single layer patterned that is formed of iridium, ruthenium or osmium, a double layer pattern that comprises an iridium pattern and a titanium aluminum nitride pattern that are sequentially stacked, and a triple layer pattern that comprises an iridium pattern, a titanium aluminum nitride pattern and a titanium pattern that are sequentially stacked.

In the embodiments of the present invention depicted in FIGS. 12 through 18, the oxygen-diffusion barrier 127a comprises a double layer pattern. As illustrated in FIG. 14, this pattern may be formed by conformally depositing a titanium aluminum nitride layer 123 in the openings 201 and on the upper insulating layer 131'. Then, an iridium layer 125 is formed on the titanium aluminum nitride layer 123 to fill the remainder of the openings 201.

As illustrated in FIG. 15, a planarization process may then be performed to expose an upper surface of the upper insulting layer 131'. Via this process, the titanium aluminum nitride layer 123 and the iridium layer 125 are removed except for portions of those layers that are within the openings 201. The planarization process may be performed, for example, by a chemical-mechanical polishing (CMP) process using slurry or by an etch back process.

Figure 16:
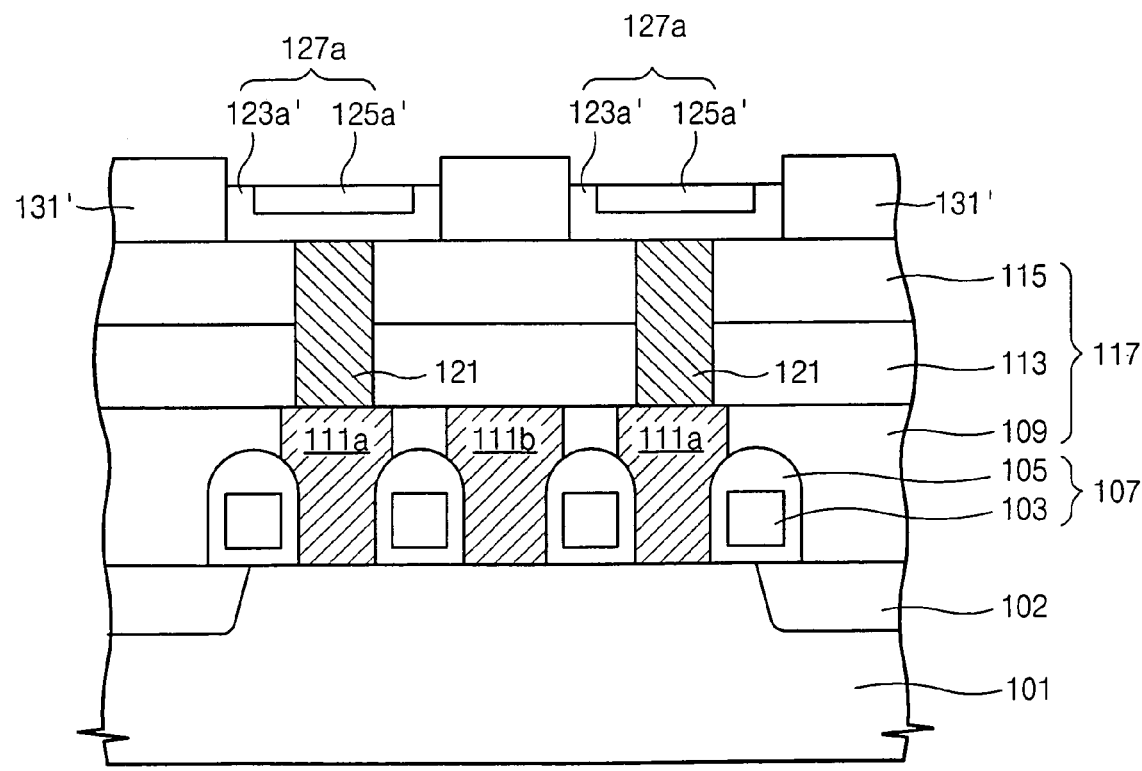

After the planarization process is completed, an etch back process may be applied to the titanium aluminum nitride layer 123 and the iridium layer 125 to form the oxygen-diffusion barrier pattern 127a. As shown in FIG. 16, the top surface of the oxygen-diffusion barrier pattern 127a may be lower than the top surface of the upper insulting layer 131'. In some embodiments of the present invention, this etch back process is omitted.

Figure 17:
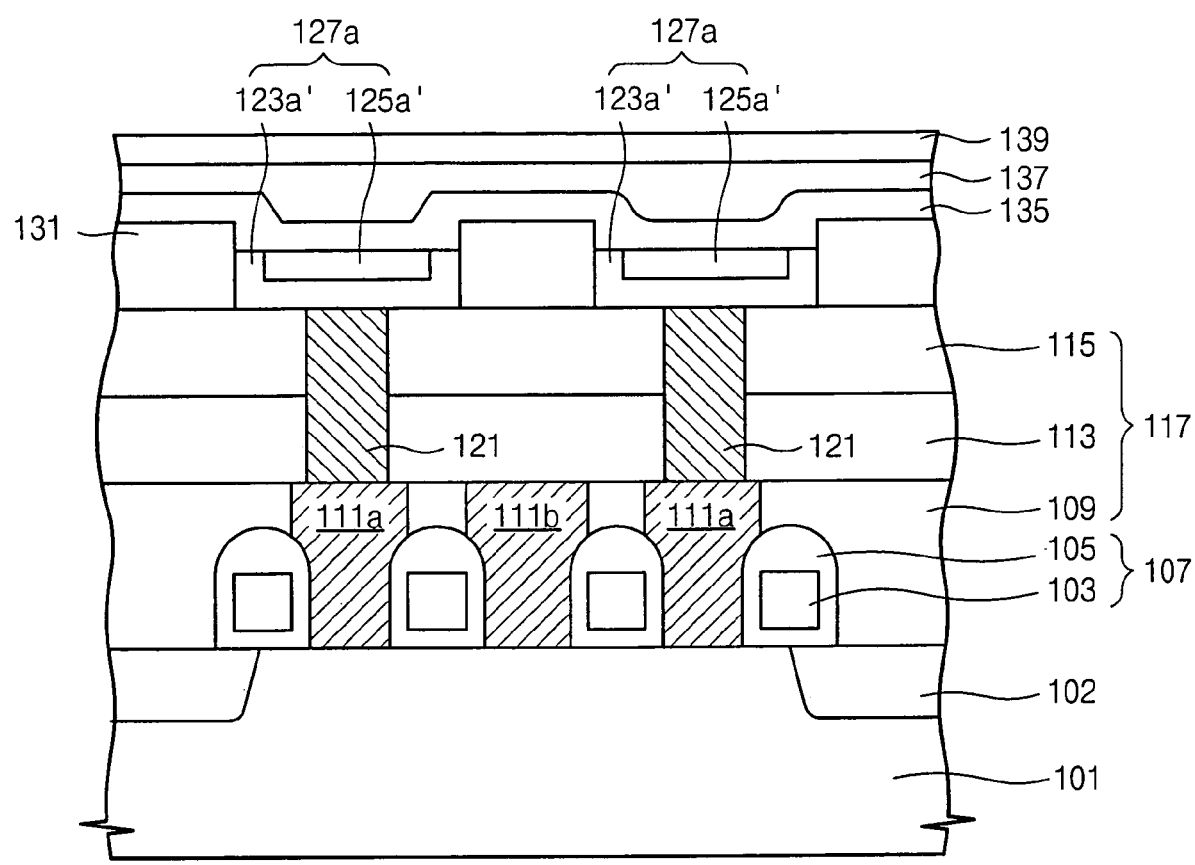

As illustrated in FIG. 17, a lower electrode layer 135 may then be formed on the oxygen-diffusion barrier pattern 127a and the upper insulating layer 131'. A ferroelectric layer 137 is formed along the lower electrode layer 135 and then an upper electrode layer 139 is formed on the ferroelectric layer 137. The ferroelectric layer may be formed on an entire surface of the lower electrode 135. This may facilitate forming a ferroelectric layer 137 that is uniform across the surface of the device.

Figure 18:
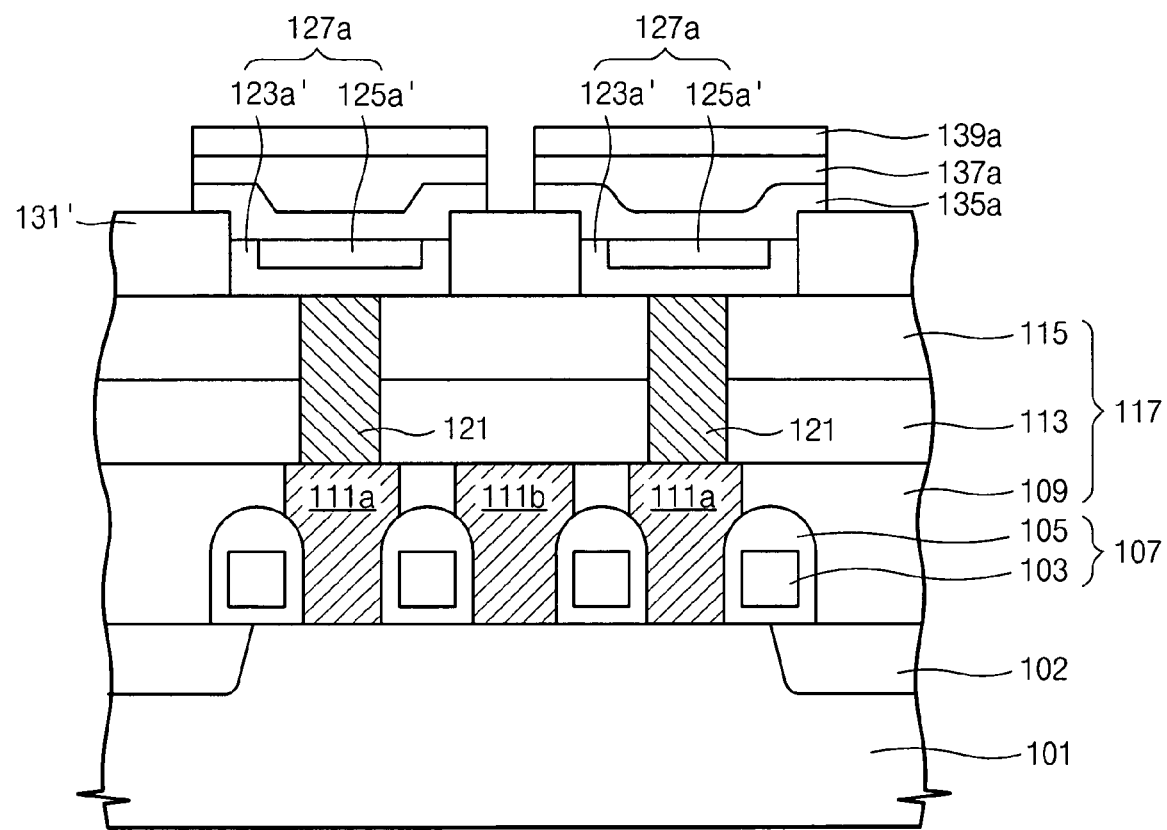

As shown in FIG. 18, the upper electrode layer 139, the ferroelectric layer 137 and the lower electrode layer 135 may be successively etched to form a lower electrode 135a, a ferroelectric pattern 137a and an upper electrode 139a on the oxygen-diffusion barrier layer 127a.

The processes for forming interconnections that are described above with respect to FIG. 11 may then be carried out to form interconnections for the device of FIG. 18.

In the embodiments of the present invention depicted in FIGS. 12 through 18, the oxygen-diffusion barrier layer is patterned before the lower electrode layer, the ferroelectric layer and the upper electrode layer are formed. As a result, etch damage to the ferroelectric layer may be reduced. By patterning the oxygen-diffusion barrier layer before the ferroelectric layer is formed, it is also possible to form the oxygen-diffusion barrier layer to an increased thickness without impacting the quality of the ferroelectric layer. The ferroelectric layer may be formed on an entire surface of the lower electrode layer, which may facilitate achieving a uniformly deposited ferroelectric layer and which may reduce or prevent reaction between the ferroelectric layer and the upper insulating layer, thereby improving the electrical characteristics of the ferroelectric device.

While the present invention has been described in connection with examplary embodiments thereof, it will be appreciated that numerous changes and modifications may be made from the specific embodiments described herein without departing from the spirit and scope of the invention. Accordingly, it will be understood that the scope of the invention is not limited by the exemplary embodiments described hereinabove, which is intended merely to be illustrative, but rather comprehends the subject matter defined by the following claims, which should be construed to encompass all methods and devices that are in accordance therewith.

What is claimed is:

1. A method of fabricating a ferroelectric memory device, the method comprising:
    forming a lower insulating layer including a conductive plug on a semiconductor substrate;
    forming an oxygen-diffusion barrier pattern that is electrically connected to the conductive plug and forming an upper insulating pattern on the lower insulating layer such that the upper insulating pattern surrounds sidewalls of the oxygen-diffusion barrier pattern and a top surface of the tipper insulating pattern is higher than a top surface of the oxygen-diffusion barrier pattern;
    forming a lower electrode layer on the upper insulating pattern and the oxygen-diffusion barrier pattern;
    forming a ferroelectric layer on the lower electrode layer;
    forming an upper electrode layer on the ferroelectric layer;
    patterning the lower electrode layer, the ferroelectric layer and the upper electrode layer; and
    after forming the upper electrode layer, forming a third insulating layer that directly contacts sidewalls of the patterned lower electrode layer, the patterned ferroelectric layer and the patterned upper electrode layer.

2. The method of claim 1, wherein the forming the oxygen-diffusion barrier pattern comprises:
    forming a conductive oxygen-diffusion barrier layer and a hard mask layer on the lower insulating layer; and
    patterning the hard mask layer and the conductive oxygen-diffusion barrier layer to be electrically connected to the contact plug.

3. The method of claim 2, wherein forming the upper insulating pattern comprises:
    forming an upper insulating layer on the lower insulating layer, the oxygen-diffusion barrier pattern and the hard mask pattern;
    planarizingly etching the upper insulating layer using the hard mask pattern as a planarization stop to form the upper insulating pattern; and
    selectively removing the hard mask pattern.

4. The method of claim 3, wherein the hard mask layer is formed of a material having etch selectivity with respect to the upper insulating layer.

5. The method of claim 3, wherein the hard mask layer is formed of a material including nitrogen.

6. The method of claim 5, wherein the material including nitrogen comprises titanium nitride, silicon nitride or titanium aluminum nitride.

7. The method of claim 1, wherein the oxygen-diffusion barrier pattern is a single layer pattern formed of iridium, ruthenium or osmium, a double layer pattern formed of sequentially stacked indium and titanium aluminum nitride or a triple layer pattern formed of sequentially stacked iridium, titanium aluminum nitride and titanium.

8. The method of claim 1, wherein the upper electrode comprises a single layer electrode formed of a noble metal or a conductive noble metal oxide or a multi-layer electrode formed of a noble metal layer and a conductive noble metal oxide layer, and wherein the lower electrode comprises a single layer electrode formed of a noble metal or a conductive noble metal oxide or a multi-layer electrode formed of a noble metal layer and a conductive noble metal oxide layer.

9. The method of claim 8, wherein the noble metal oxide electrode includes iridium oxide, ruthenium oxide, lanthanum strontium cobalt oxide (LSCO), yttrium barium cobalt oxide (YBCO) or lanthanum nickel oxide (LNO).

10. The method of claim 8, wherein the noble metal comprises platinum, iridium, ruthenium, osmium, and lanthanum.

11. The method of claim 1, wherein forming the ferroelectric layer comprises depositing the ferroelectric layer on the entire surface of the lower electrode layer.

12. The method of claim 1, wherein the ferroelectric layer is deposited directly on only the lower electrode layer.

13. The method of claim 1, wherein the lower electrode layer is a single layer lower electrode layer that is in direct contact with both the oxygen diffusion barrier pattern and with the ferroelectric layer.

14. The method of claim 1, further comprising:
    forming a transistor at the semiconductor substrate;
    forming a first interlayer insulating layer on the semiconductor substrate and on the transistor;
    forming an opening in the first interlayer insulating layer to expose a source/drain region of the transistor;
    forming a conductive material in the opening to form a capacitor contact pad; and wherein the conductive plug is formed to be in electrical contact with the capacitor contact pad.

15. A method of forming a ferroelectric memory device comprising:
forming a lower insulating layer including a contact plug on a semiconductor substrate;
forming an upper insulating layer on the lower insulting layer;
patterning the tipper insulating layer to form an opening exposing the conductive plug;
forming an oxygen-diffusion barrier pattern in the opening such that a top surface of the oxygen-diffusion barrier pattern is lower than a top surface of the upper insulating layer;
conformally forming a lower electrode layer directly on both an upper surface of the upper insulating layer and an upper surface of the oxygen-diffusion barrier pattern;
forming a ferroelectric layer on the lower electrode layer;
forming an upper electrode layer on the ferroelectric layer; and then
patterning the upper electrode layer, the ferroelectric layer and the lower electrode layer.

16. The method of claim 15, wherein the oxygen-diffusion barrier pattern is a single layer pattern formed of iridium, ruthenium or osmium, a double layer pattern formed of sequentially stacked iridium and titanium aluminum nitride or a triple layer pattern formed of sequentially stacked iridium, titanium aluminum nitride and titanium.

17. The method of claim 15, wherein the lower electrode comprises a single layer electrode formed of a noble metal or a conductive noble metal oxide or a multi-layer electrode formed of a noble metal layer and a conductive noble metal oxide layer, and wherein the upper electrode comprises a single layer electrode formed of a noble metal or a conductive noble metal oxide or a multi-layer electrode formed of a noble metal layer and a conductive noble metal oxide layer.

18. The method of claim 15, wherein forming the oxygen-diffusion barrier pattern comprises:
forming an oxygen-diffusion barrier layer in the opening; and
etching a portion of the oxygen-diffusion barrier layer filling the opening.

19. The method of claim 18, wherein forming a lower insulating layer including a conductive plug on a semiconductor substrate comprises:
forming the lower insulating layer on the first interlayer insulating layer and on the capacitor contact pad;
patterning the lower insulating layer to form a contact hole that exposes a top surface of the capacitor contact pad; and
forming the conductive plug in the contact hole.

20. The method of claim 15, wherein the ferroelectric layer is deposited directly on only the lower electrode layer.

21. The method of claim 20, wherein the lower electrode layer is a single layer lower electrode layer that is in direct contact with both the oxygen diffusion barrier pattern and with the ferroelectric layer.

22. The method of claim 15, further comprising:
forming a transistor at the semiconductor substrate;
forming a first interlayer insulating layer on the semiconductor substrate and on the transistor;
forming an opening in the first interlayer insulating layer to expose a source/drain region of the transistor;
forming a conductive material in the opening to form a capacitor contact pad; and
wherein the conductive plug is formed to be in electrical contact with the capacitor contact pad.

23. The method of claim 22, wherein forming a lower insulating layer including a conductive plug on a semiconductor substrate comprises:
forming the lower insulating layer on the first interlayer insulating layer and on the capacitor contact pad;
patterning the lower insulating layer to form a contact hole that exposes a top surface of the capacitor contact pad; and
forming the conductive plug in the contact hole.

24. The method of claim 15, further comprising forming a third insulating layer that directly contacts sidewalls of the patterned lower electrode layer, the patterned ferroelectric layer and the patterned upper electrode layer.

25. A method of fabricating a ferroelectric memory device, the method comprising:
forming a lower insulating layer including a conductive plug on a semiconductor substrate;
forming an oxygen-diffusion barrier layer that is electrically connected to the conductive plug, wherein the oxygen-diffusion barrier pattern is a single layer pattern formed of iridium, ruthenium or osmium, a double layer pattern formed of sequentially stacked iridium and titanium aluminum nitride or a triple layer pattern formed of sequentially stacked iridium, titanium aluminum nitride and titanium;
forming a hard mask layer directly on the oxygen-diffusion barrier layer;
patterning the hard mask layer and the oxygen-diffusion barrier layer to provide a hard mask pattern and an oxygen diffusion barrier pattern such that the oxygen diffusion barrier pattern is electrically connected to the conductive plug;
forming an upper insulating pattern on the lower insulating layer such that the upper insulating pattern surrounds sidewalls of the oxygen-diffusion barrier pattern and a top surface of the upper insulating pattern is higher than a top surface of the oxygen-diffusion barrier pattern;
removing the hard mask pattern;
forming a lower electrode layer on the upper insulating pattern and the oxygen-diffusion barrier pattern;
forming a ferroelectric layer on the lower electrode layer; and
forming an upper electrode layer on the ferroelectric layer.

26. The method of claim 25, further comprising:
patterning the lower electrode layer, the ferroelectric layer and the upper electrode layer; and
after forming the upper electrode layer, forming a third insulating layer that directly contacts sidewalls of the patterned lower electrode layer, the patterned ferroelectric layer and the patterned upper electrode layer.

27. The method of claim 26, wherein forming a lower electrode layer on the upper insulating pattern and the oxygen-diffusion barrier pattern comprises conformally forming a lower electrode layer directly on both an upper surface of the upper insulating layer and an upper surface of the oxygen-diffusion barrier pattern.

28. The method of claim 27, wherein the ferroelectric layer is deposited directly on only the lower electrode layer.

* * * * *

UNITED STATES PATENT AND TRADEMARK OFFICE
CERTIFICATE OF CORRECTION

PATENT NO. : 7,052,951 B2
APPLICATION NO. : 10/776394
DATED : May 30, 2006
INVENTOR(S) : Joo et al.

It is certified that error appears in the above-identified patent and that said Letters Patent is hereby corrected as shown below:

On the Title Page,
Section 54 should read -- METHODS FOR FABRICATING FERROELECTRIC MEMORY DEVICES WITH ENHANCED FERROELECTRIC PROPERTIES --

Column 1,
Lines 1-4 should read -- METHODS FOR FABRICATING FERROELECTRIC MEMORY DEVICES WITH ENHANCED FERROELECTRIC PROPERTIES --

Column 11,
Line 59 should read -- surface of the upper insulating pattern is higher than a --

Column 12,
Line 1 should read -- after patterning the lower electrode layer, the ferroelectric layer and the upper electrode layer, forming a third --

Line 32 should read -- sequentially stacked iridium and titanium aluminum nitride --

Column 13,
Line 5 should read -- forming a lower insulating layer including a conductive plug --

Line 9 should read -- pattering the upper insulating layer to form an opening --

Line 45 should read -- 19. The method of claim 15, wherein forming a lower --

UNITED STATES PATENT AND TRADEMARK OFFICE
CERTIFICATE OF CORRECTION

PATENT NO. : 7,052,951 B2
APPLICATION NO. : 10/776394
DATED : May 30, 2006
INVENTOR(S) : Joo et al.

It is certified that error appears in the above-identified patent and that said Letters Patent is hereby corrected as shown below:

<u>Column 14,</u>
Line 52 should read -- after patterning the lower electrode layer, the ferroelectric layer and the upper electrode layer, forming a third --

Signed and Sealed this

Fifth Day of December, 2006

JON W. DUDAS
*Director of the United States Patent and Trademark Office*